(12) United States Patent
Li (10) Patent No.: US 11,317,524 B2
(45) Date of Patent: Apr. 26, 2022

(54) ROLLABLE DISPLAY DEVICE AND ROLLABLE DISPLAY APPARATUS

(71) Applicant: WUHAN CHINA STAR OPTOELECTRONICS SEMICONDUCTOR DISPLAY TECHNOLOGY CO., LTD., Wuhan (CN)

(72) Inventor: Wenqi Li, Wuhan (CN)

( * ) Notice: Subject to any disclaimer, the term of this patent is extended or adjusted under 35 U.S.C. 154(b) by 60 days.

(21) Appl. No.: 17/053,778

(22) PCT Filed: Jun. 22, 2020

(86) PCT No.: PCT/CN2020/097422
§ 371 (c)(1),
(2) Date: Nov. 8, 2020

(87) PCT Pub. No.: WO2021/223296
PCT Pub. Date: Nov. 11, 2021

(65) Prior Publication Data
US 2021/0352810 A1    Nov. 11, 2021

(30) Foreign Application Priority Data
May 7, 2020 (CN) .......................... 202010376311.3

(51) Int. Cl.
*H05K 5/00* (2006.01)
(52) U.S. Cl.
CPC ......... *H05K 5/0017* (2013.01); *H05K 5/0026* (2013.01)

(58) Field of Classification Search
None
See application file for complete search history.

(56) References Cited

U.S. PATENT DOCUMENTS

| | | | |
|---|---|---|---|
| 10,191,517 B2* | 1/2019 | Kang | G06F 1/1652 |
| 10,194,543 B2* | 1/2019 | Seo | G06F 1/1626 |
| 10,582,621 B2* | 3/2020 | Gu | H05K 5/0026 |
| 10,706,785 B2* | 7/2020 | Kim | G09G 3/3275 |
| 10,847,066 B2* | 11/2020 | Lee | H05K 1/189 |
| 2008/0049003 A1* | 2/2008 | Hasegawa | G06F 1/1637 |
| | | | 345/206 |
| 2013/0335929 A1 | 12/2013 | Cavallaro | |
| 2014/0194165 A1* | 7/2014 | Hwang | G06F 1/1652 |
| | | | 455/566 |

(Continued)

FOREIGN PATENT DOCUMENTS

| | | |
|---|---|---|
| CN | 104851892 A | 8/2015 |
| CN | 105518765 A | 4/2016 |

(Continued)

*Primary Examiner* — Xanthia C Cunningham (57) ABSTRACT

The present invention provides a rollable display device and a rollable display apparatus. The rollable display device includes a rollable display panel and at least one main flexible circuit board. The rollable display panel includes a driving portion having at least one connection portion. The connection portion includes a wiring region including a plurality of external lines, and one end of each of the external lines is connected to the display region. The main flexible circuit board is arranged corresponding to a flexible connector, and a width of the main flexible circuit board is less than a predetermined value.

20 Claims, 5 Drawing Sheets

(56) References Cited

U.S. PATENT DOCUMENTS

| | | | |
|---|---|---|---|
| 2016/0374228 A1* | 12/2016 | Park | G09F 15/0062 |
| 2017/0023979 A1* | 1/2017 | Yamazaki | H01L 51/0097 |
| 2017/0318688 A1* | 11/2017 | Kim | H05K 1/147 |
| 2017/0365652 A1 | 12/2017 | Li | |
| 2018/0081473 A1* | 3/2018 | Seo | H05K 5/0217 |
| 2018/0210575 A1 | 7/2018 | Xie et al. | |
| 2019/0350081 A1* | 11/2019 | Park | G06F 1/1652 |
| 2020/0093011 A1* | 3/2020 | Lee | H05K 5/0217 |
| 2020/0103691 A1* | 4/2020 | Ohashi | G02F 1/13452 |

FOREIGN PATENT DOCUMENTS

| | | |
|---|---|---|
| CN | 205213144 U | 5/2016 |
| CN | 106775172 A | 5/2017 |
| CN | 107358872 A | 11/2017 |
| CN | 208110192 U | 11/2018 |
| CN | 109377890 A | 2/2019 |
| WO | 2013191859 A2 | 12/2013 |

\* cited by examiner

ROLLABLE DISPLAY DEVICE AND ROLLABLE DISPLAY APPARATUS

FIELD OF DISCLOSURE

The present invention relates to a field of display technology and in particular, to a rollable display device and a rollable display apparatus.

DESCRIPTION OF RELATED ART

There has been a trend for developing rollable display devices due to their rollable features.

However, conventional rollable display panels have larger driving portions, so the rollable display panels cannot be completely received, and thus their bezels are increased in size, which leads to the large volume (a large size) of the rollable display device.

SUMMARY

The present invention is directed to providing a rollable display device and a rollable display apparatus, which can reduce a size of a bezel, thereby reducing the volume of the rollable display device.

Accordingly, the present invention provides a rollable display device, comprising:
a rollable display panel, comprising:
a display region; and
at least one driving portion, wherein the driving portion is disposed at one side of the display region, and the driving portion comprises at least one connection portion, the connection portion comprising:
a wiring region comprising a plurality of external lines, wherein one end of each of the external lines is connected to the display region; and
a flexible connector connected to another end of each of the external lines;
at least one main flexible circuit board, wherein the main flexible circuit board is arranged corresponding to the flexible connector; and
at least one main board, wherein the main board is arranged corresponding to the main flexible circuit board, and the main board is connected to the flexible connector through the main flexible circuit board.

The present invention further provides a rollable display apparatus which comprises the rollable display device.

The rollable display device and the rollable display apparatus of the present invention comprises:
a rollable display panel, comprising:
a display region; and
at least one driving portion, wherein the driving portion is disposed at one side of the display region, and the driving portion comprises at least one connection portion, the connection portion comprising:
a wiring region comprising a plurality of external lines, wherein one end of each of the external lines is connected to the display region; and
a flexible connector connected to another end of each of the external lines;
at least one main flexible circuit board, wherein the main flexible circuit board is arranged corresponding to the flexible connector, and a width of the main flexible circuit board is less than a predetermined value; and
at least one main board, wherein the main board is arranged corresponding to the main flexible circuit board, and the main board is connected to the flexible connector through the main flexible circuit board.

Since the width of the main flexible circuit board is relatively narrow, the size of the lower bezel of the rollable display panel is reduced, thereby reducing the volume of the rollable display device.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DETAILED DESCRIPTION OF EMBODIMENTS

A description of the present invention is provided below with reference to the accompanying drawings and in conjunction with specific embodiments. Directional terms mentioned in the present invention, such as "upper", "lower", "front", "rear", "left", "right", "inner", "outer", "side", are for illustrative purposes based on the accompanying drawings. Therefore, the directional terms are used to describe and understand the present invention, but not to limit the present invention. In the drawings, structurally similar components are denoted by the same reference numerals.

The terms "first" and "second" in the description and claims of the present invention and the above drawings are used to distinguish different objects, rather than describe a specific order. In addition, the terms "comprising" and "including" and any variations thereof are intended to cover non-exclusive inclusions.

Figure 1:
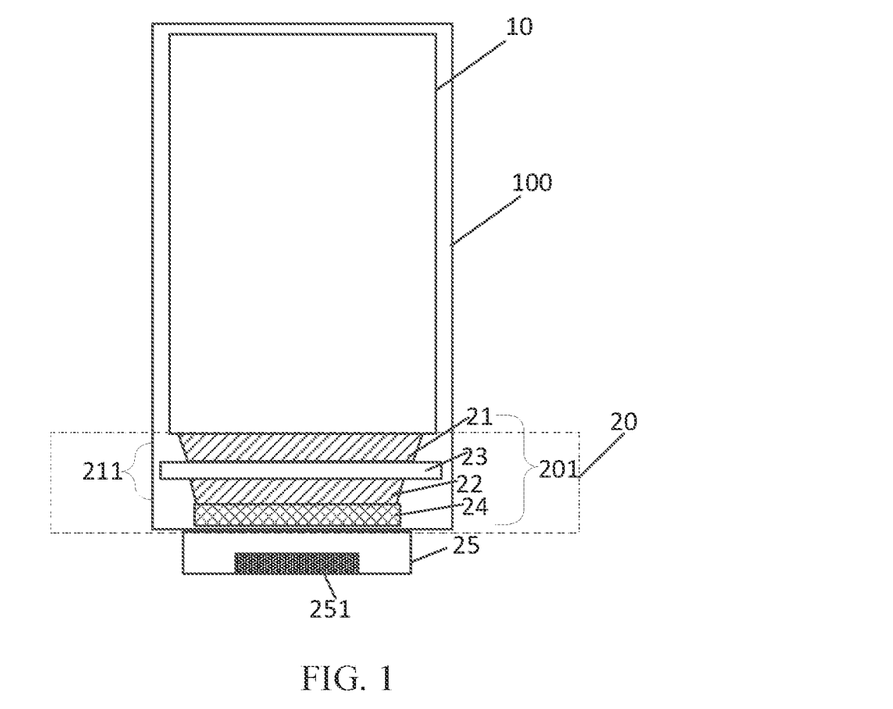
FIG. 1 is a schematic structural view illustrating a rollable display device according to one embodiment of the present invention.

Please refer to FIGS. 1 to 4. FIG. 1 is a schematic structural view illustrating a rollable display device according to one embodiment of the present invention.

Figure 2:
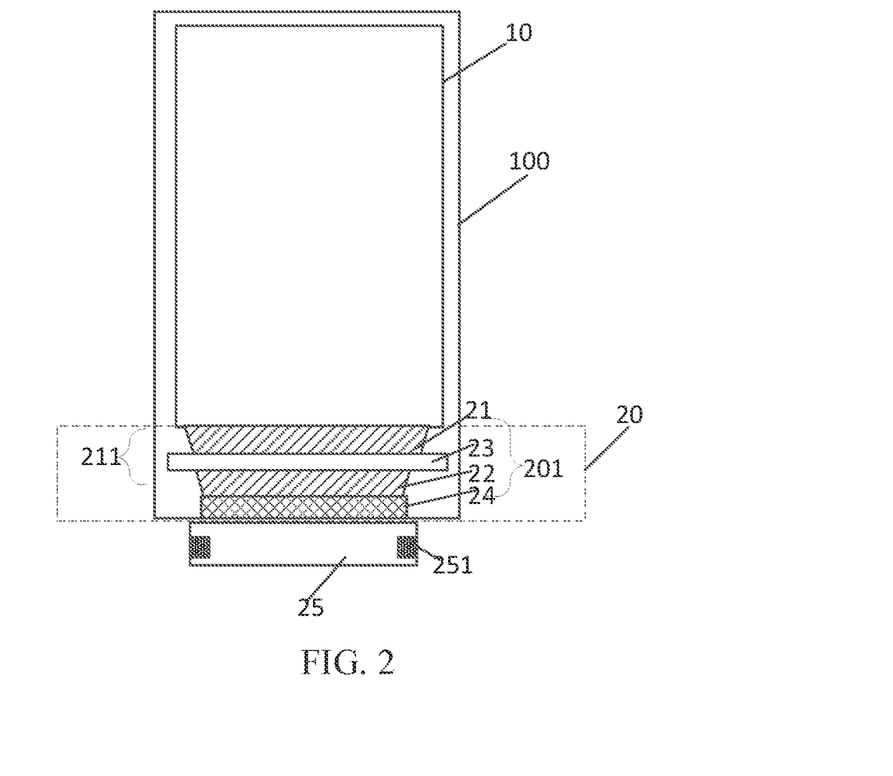
FIG. 2 is a schematic structural view illustrating the rollable display device according to another embodiment of the present invention.

As shown in FIGS. 1 and 2, the rollable display device of the present embodiment comprises a rollable display panel 100. The rollable display panel 100 includes a display region 10 and a driving portion 20.

The display region 10 is used to display images. According to one embodiment, the display region 10 comprises a plurality of pixel units, wherein each pixel unit includes a red sub-pixel, a green sub-pixel, and a blue sub-pixel. The display region 10 can further include a plurality of data lines and a plurality of scan lines.

The driving portion 20 is disposed at one side of the display region 10, and the driving portion 20 comprises a connection portion 201. The connection portion 201 comprises a wiring region 211 and a flexible connector 24. The wiring region 211 comprises a plurality of external lines (not illustrated), wherein one end of each of the external lines is connected to the display region 10 and to be specific, connected to the data line in the display region 10. In one embodiment, the wiring region 211 comprises a first sub-wiring region 21 and a second sub-wiring region 22, wherein a pad bending region 23 is arranged between the first sub-wiring region 21 and the second sub-wiring region 22. The first sub-wiring region 21 and the second sub-wiring region 22 are provided with the external lines, and the external lines in the two sub-wiring regions are arranged in a same layer. The pad bending region 23 can facilitate the rolling of the wiring region and prevent the above-mentioned external lines from breaking.

The flexible connector 24 is connected to another end of each of the external lines.

The main flexible circuit board 25 is arranged corresponding to the flexible connector 24, and a width of the main flexible circuit board 25 is less than a predetermined value; and the predetermined value can be set according to requirements.

Figure 4:
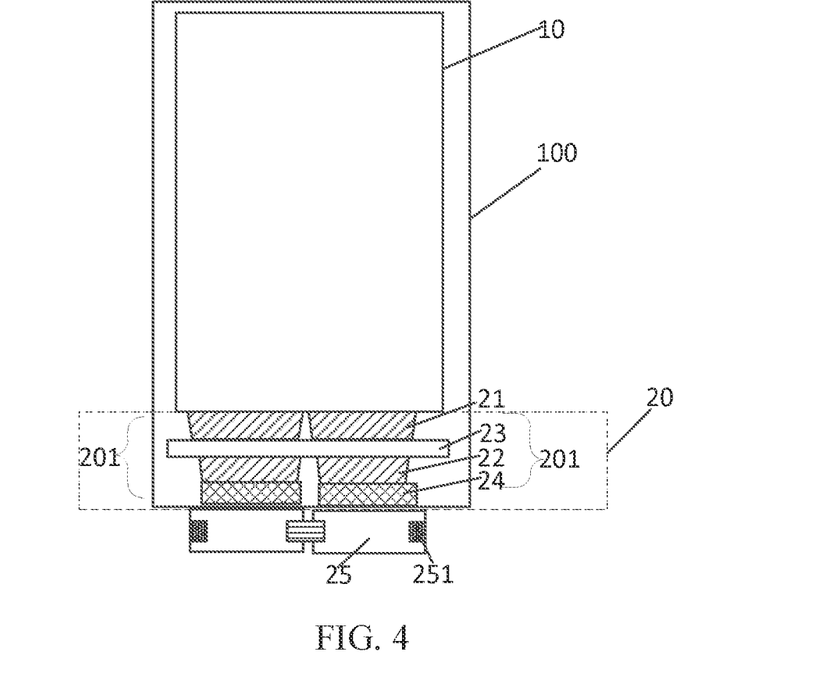
FIG. 4 is a schematic structural view illustrating the rollable display device according to yet another embodiment of the present invention.
Figure 5:
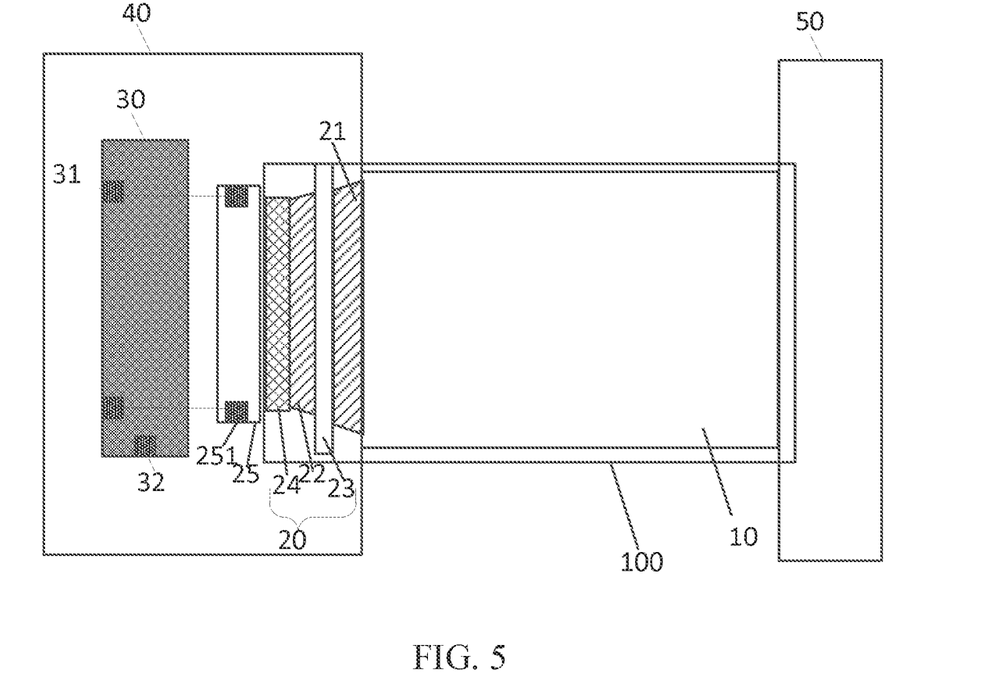
FIG. 5 is a schematic structural view illustrating the rollable display apparatus according to one embodiment of the present invention.
Figure 6:
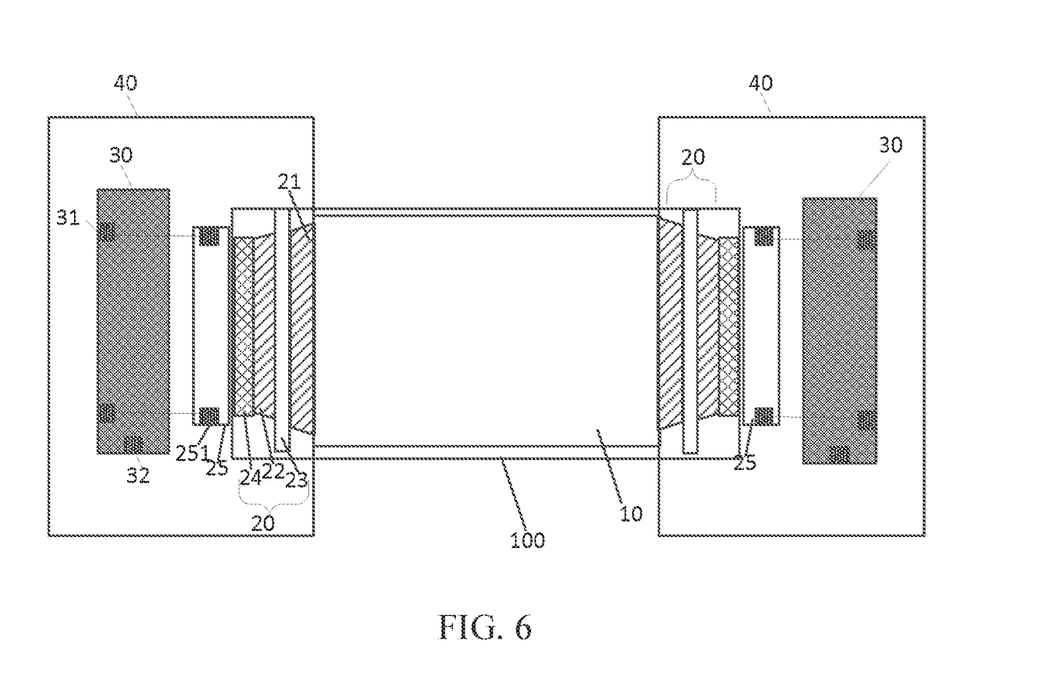
FIG. 6 is a schematic structural view illustrating the rollable display apparatus according to another embodiment of the present invention.

Also referring to FIGS. 4 to 6, the main board 30 is arranged corresponding to the main flexible circuit board 25, and the main board 30 is connected to the flexible connector 24 through the main flexible circuit board 25. According to one embodiment, a top portion of the main board 30 is connected to a bottom portion of the main flexible circuit board 25. A signal input end 251 is disposed on the main flexible circuit board 25. With reference to FIG. 1, the signal input end 251 can be disposed on the bottom portion of the flexible circuit board 25, the main board 30 is provided with a signal output end 31 which is connected to the signal input end 251. The main board 30 is also provided with a signal source receiving end 32 for receiving external driving signals, and the external driving signals are also image data. In other embodiments, a side wall of the main board 30 is connected to a side wall of the main flexible circuit board 25. With reference to FIG. 2, the signal input end 251 can be disposed on the side wall of the main flexible circuit board 25, and the signal output end 31 is disposed on the side wall of the main board 31. The main flexible circuit board 25 comprises two signal input ends 251 for example, and with reference to FIG. 5, the main board 30 is provided with two signal output ends 31, wherein the signal input ends 251 can be located on two opposite sides of the main flexible circuit board 25 to further reduce a size of the driving portion.

Figure 3:
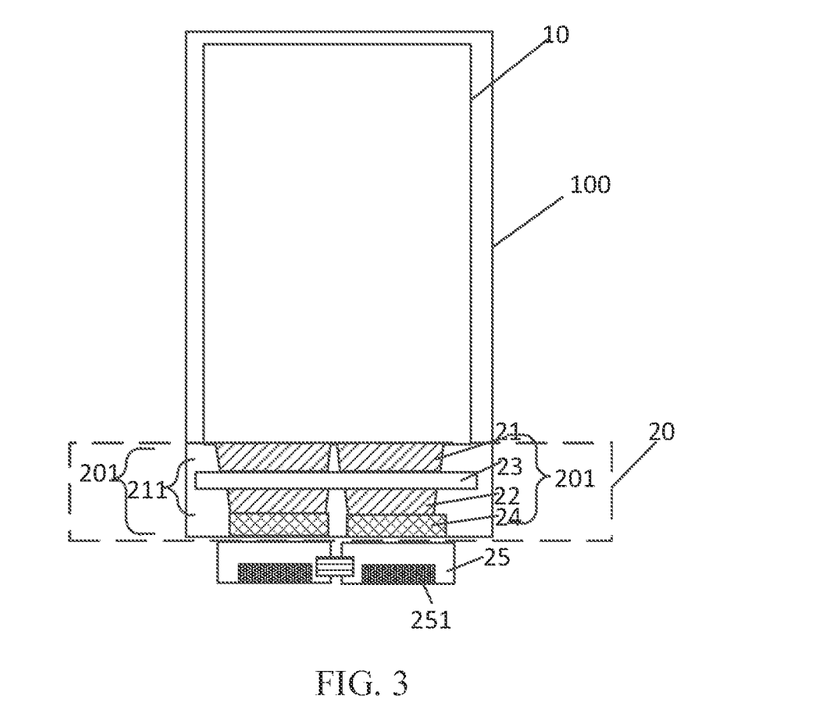
FIG. 3 is a schematic structural view illustrating the rollable display device according to still another embodiment of the present invention.

In other embodiments, as shown in FIGS. 3 and 4, the driving portion 20 comprises two connection portions 201, i.e., the first connection portion 201 and the second connection portion 201. The main flexible circuit board 25 corresponding to the flexible connector 24 of the first connection portion 201 is connected to the main flexible circuit board 25 corresponding to the flexible connector 24 of the second connection portion 201. That is to say, the main flexible circuit board 25 on the left and the main flexible circuit board 25 on the right can be connected by another flexible circuit board. In one embodiment, in order to further prevent the connection portion from being damaged, the pad bending region of the first connection portion 201 communicates with the pad bending region of the second connection portion 201. Certainly, in other embodiments, the pad bending region 23 of the first connection portion 201 and the pad bending region 23 of the second connection portion 201 do not communicate with each other.

As shown in FIG. 6, in other embodiments, in order to shorten an input duration of a driving signal and improve the efficiency, the rollable display device can also comprise two driving portions 20, i.e., the first driving portion 20 and the second driving portion 20. The first driving portion 20 and the second driving portion 20 are disposed opposite to each other, that is, the first driving portion 20 and the second driving portion 20 are respectively located at a first side and a second side of the display region 10. The first side and the second side are disposed opposite to each other. The driving portions 20 are arranged corresponding to the main boards 30 in one-to-one correspondence.

Figure 7:
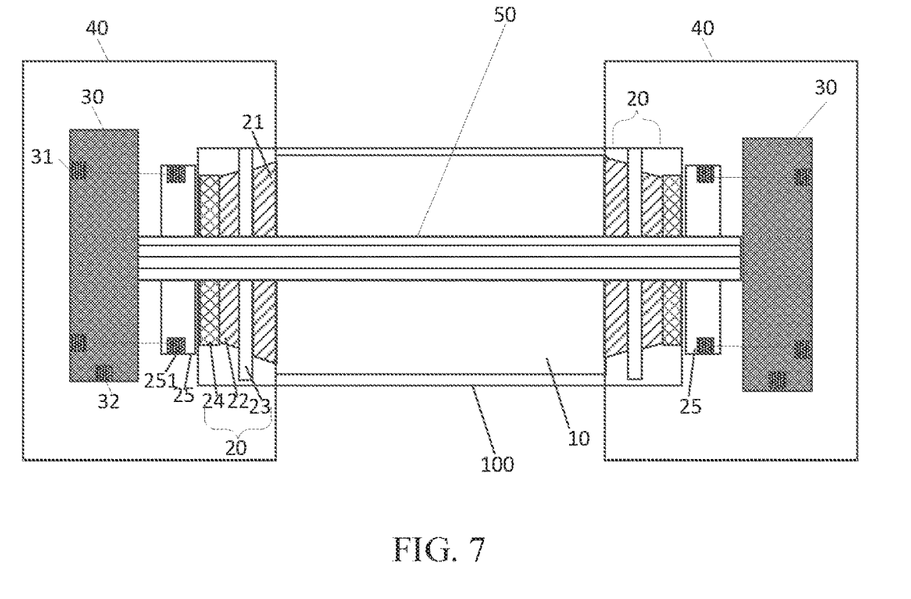
FIG. 7 is a schematic structural view illustrating the rollable display apparatus according to still another embodiment of the present invention.

As shown in FIG. 7, in order to avoid unsynchronized images on left and right halves of the rollable display device, the main board 30 corresponding to the first driving portion 20 and the main board 30 corresponding to the second driving portion 20 both receive a synchronization signal, that is, both the main board 30 on the left and the main board 30 on the right receive the synchronization signal, thereby avoiding dark lines or bright lines appearing in the middle of the display region 10.

In one embodiment, the main board 30 corresponding to the first driving portion 20 has a first synchronization end (not illustrated), and the main board 30 corresponding to the second driving portion 20 has a second synchronization end (not illustrated). The first synchronization end and the second synchronization end are connected through an auxiliary flexible circuit board 50. In other embodiments, wireless communication modules can be integrated on the main boards 30 to realize mutual transmission of the synchronization signals to achieve synchronization of driving timing at both sides. Certainly, a connection line between the first and second synchronization ends can be directly integrated into the display panel. Since interconnections here mainly transfer timing signals and voltage signals, the connection line of these signals can be designed into a certain metal layer of the panel (the rollable display panel). Signals are transmitted from the main board on one side to the flexible circuit board on the same side, then transmitted to the other side of the panel through the connection line in a conductive layer inside the panel, and after that, transmitted to the main board at the other side of the panel through the flexible circuit board at the same side to realize real-time communication. However, specific configurations are not limited in this regard.

Since the width of the flexible circuit board is relatively narrow, thereby reducing a size of a lower bezel of the rollable display panel, meeting requirements for a curvature radius to reduce the volume of the rollable display device.

Figure 8:
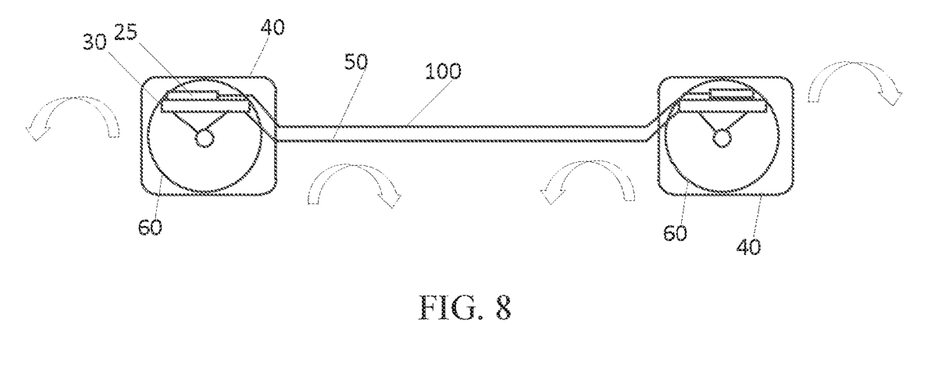
FIG. 8 is a front view illustrating the rollable display apparatus according to one embodiment of the present invention.

The present invention also provides a rollable display apparatus, comprising the rollable display device described above. In one embodiment, as shown in FIG. 8, the rollable display apparatus further comprises one or two panel rollers 60 having a circular shape, and can further comprise two housings 40. The main flexible circuit board 25 and the main board 30 are also fixed to the panel roller 60. The panel roller 60 is used to enable the rollable display panel 100 to be wound around and unrolled from an outer peripheral surface of the panel roller 60. The panel rollers 60 are accommodated in the housings 40.

The housing 40 accommodates the rollable display panel 100, the panel roller 60, and a driving device. The driving device is configured to drive the panel roller 60 to rotate. The driving device can include a motor, a gear, and a power source. The housing 40 can be circular, elliptical, quadrangular, rectangular, or polygonal.

When the rollable display apparatus comprises two panel rollers 60, the display panel can be rolled up from both sides at this time. For example, when the panel roller 60 on the left rotates counterclockwise, and the panel roller 60 on the right rotates clockwise, the display panel is retracted into the housing 40. On the contrary, when the left panel roller 60 rotates clockwise, and when the right panel roller 60 rotates counterclockwise for example, the display panel is pulled out of the housing 40.

Figure 9:
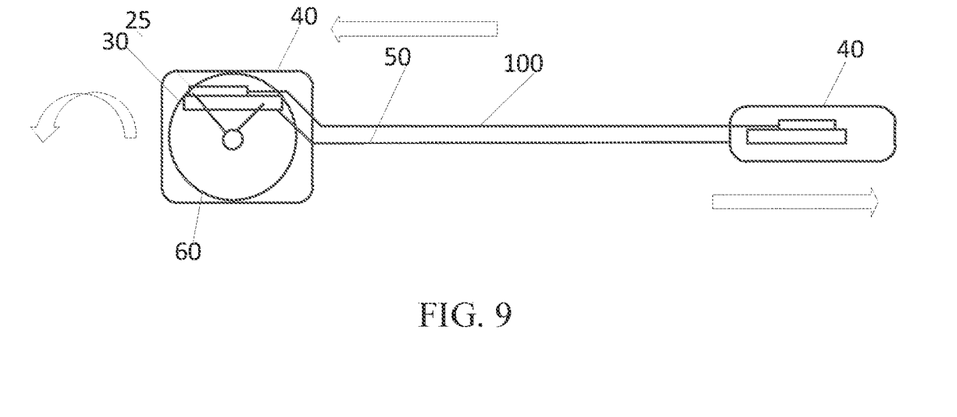
FIG. 9 is a front view illustrating the rollable display apparatus according to another embodiment of the present invention.

As shown in FIG. 9, when the rollable display apparatus comprises one panel roller 60, the display panel is rolled up from one side. When the panel roller 60 on the left rotates counterclockwise, the display panel is retracted into the housing 40. On the contrary, when the panel roller 60 on the left rotates clockwise, or when the housing 40 on the right is pulled, the display panel is pulled out of the housing 40.

Figure 10:
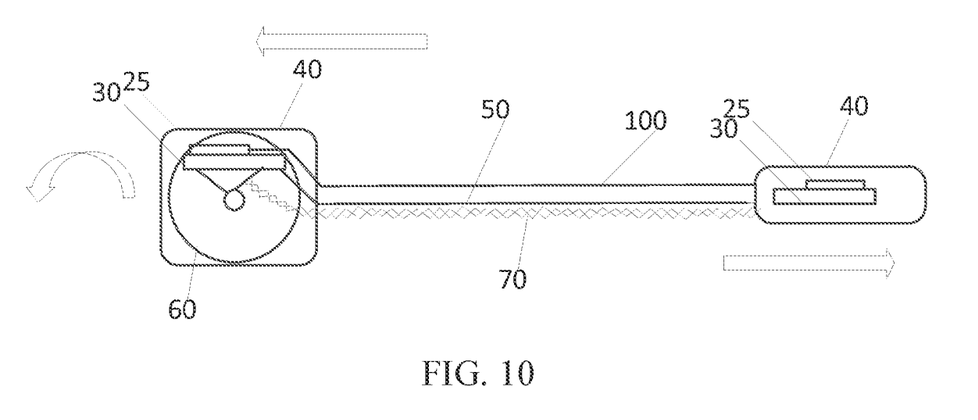
FIG. 10 is a front view illustrating the rollable display apparatus according to still another embodiment of the present invention.

As shown in FIG. 10, the rollable display device comprises two main boards, namely a first main board and a second main board. In one embodiment, a support member 70 is disposed under the auxiliary flexible circuit board 50. A first housing 40 (the housing on the left) is used to accommodate the panel roller 60, the first main board 30 (the main board on the left), and the main flexible circuit board 25. A second housing 40 (the housing on the right) for accommodating the second main board 30 (the main board on the right). One end of the support member 70 is connected to the panel roller 60, and the other end of the support member 70 is connected to the second housing 40. In one embodiment, the support member 70 is a hinge structure.

Since the flexible circuit board adopts a very narrow width configuration, and when signal lines are connected to the main boards from two sides of the flexible circuit board, the flexible circuit board can be retracted into the housing 40, or the flexible circuit board can also be located outside the housing 40.

The rollable display device and the rollable display apparatus of the present invention comprises:
a rollable display panel, comprising:
a display region; and
at least one driving portion, wherein the driving portion is disposed at one side of the display region, and the driving portion comprises at least one connection portion, the connection portion comprising:
a wiring region comprising a plurality of external lines, wherein one end of each of the external lines is connected to the display region; and
a flexible connector connected to another end of each of the external lines;
at least one main flexible circuit board, wherein the main flexible circuit board is arranged corresponding to the flexible connector, and a width of the main flexible circuit board is less than a predetermined value; and
at least one main board, wherein the main board is arranged corresponding to the main flexible circuit board, and the main board is connected to the flexible connector through the main flexible circuit board.

Since the width of the main flexible circuit board is relatively narrow, the size of the lower bezel of the rollable display panel is reduced, thereby reducing the volume of the rollable display device.

In summary, although the present invention has been disclosed in conjunction with preferable embodiments above, the above preferable embodiments are not intended to limit the present invention. Those of ordinary skill in the art can make various changes and modifications without departing from the spirit and scope of the present invention. Therefore, such changes and modifications are deemed to be within the protection scope of the present invention defined by the claims.

What is claimed is:

1. A rollable display device, comprising:
a rollable display panel, comprising:
a display region; and
at least one driving portion, wherein the driving portion is disposed at one side of the display region, and the driving portion comprises at least one connection portion, the connection portion comprising:
a wiring region comprising a plurality of external lines, wherein one end of each of the external lines is connected to the display region; and
a flexible connector connected to another end of each of the external lines;
at least one main flexible circuit board, wherein the main flexible circuit board is arranged corresponding to the flexible connector, and a width of the main flexible circuit board is less than a predetermined value; and
at least one main board, wherein the main board is arranged corresponding to the main flexible circuit board, and the main board is connected to the flexible connector through the main flexible circuit board.

2. The rollable display device according to claim 1, wherein the driving portion comprises a first connection portion and a second connection portion; and
the main flexible circuit board arranged corresponding to the flexible connector of the first connection portion is connected to the main flexible circuit board arranged corresponding to the flexible connector of the second connection portion.

3. The rollable display device according to claim 1, wherein the wiring region comprises a first sub-wiring region and a second sub-wiring region, and a pad bending region is arranged between the first sub-wiring region and the second sub-wiring region.

4. The rollable display device according to claim 3, wherein the driving portion comprises a first connection portion and a second connection portion; and
the pad bending region of the first connection portion communicates with the pad bending region of the second connection portion.

5. The rollable display device according to claim 1, wherein the rollable display device comprises a first driving portion and a second driving portion; and the first driving portion and the second driving portion are disposed opposite to each other.

6. The rollable display device according to claim 5, wherein the main board corresponding to the first driving portion and the main board corresponding to the second driving portion both receive a synchronization signal.

7. The rollable display device according to claim 6, wherein the main board corresponding to the first driving portion comprises a first synchronization end, the main board corresponding to the second driving portion comprises a second synchronization end, and the first synchronization end and the second synchronization end are connected by an auxiliary flexible circuit board.

8. The rollable display device according to claim 7, wherein a side wall of the main board is connected to a side wall of the main flexible circuit board.

9. The rollable display device according to claim 8, wherein the main flexible circuit board comprises a signal input end, and the signal input end is disposed on the side wall of the main flexible circuit board.

10. The rollable display device according to claim 9, wherein the main flexible circuit board comprises two signal input ends, and the two signal input ends are located on two opposite sides of the main flexible circuit board, respectively.

11. A rollable display apparatus comprising a rollable display device, the rollable display device comprising:
   a rollable display panel, comprising:
      a display region; and
      at least one driving portion, wherein the driving portion is disposed at one side of the display region, and the driving portion comprises at least one connection portion, the connection portion comprising:
         a wiring region comprising a plurality of external lines, wherein one end of each of the external lines is connected to the display region; and
         a flexible connector connected to another end of each of the external lines;
   at least one main flexible circuit board, wherein the main flexible circuit board is arranged corresponding to the flexible connector, and a width of the main flexible circuit board is less than a predetermined value; and
   at least one main board, wherein the main board is arranged corresponding to the main flexible circuit board, and the main board is connected to the flexible connector through the main flexible circuit board.

12. The rollable display apparatus according to claim 11, wherein the driving portion comprises a first connection portion and a second connection portion; and
   the main flexible circuit board arranged corresponding to the flexible connector of the first connection portion is connected to the main flexible circuit board arranged corresponding to the flexible connector of the second connection portion.

13. The rollable display apparatus according to claim 11, wherein the wiring region comprises a first sub-wiring region and a second sub-wiring region, and a pad bending region is arranged between the first sub-wiring region and the second sub-wiring region.

14. The rollable display apparatus according to claim 13, wherein the driving portion comprises a first connection portion and a second connection portion; and
   the pad bending region of the first connection portion is connected to the pad bending region of the second connection portion.

15. The rollable display apparatus according to claim 11, wherein the rollable display device comprises a first driving portion and a second driving portion; and the first driving portion and the second driving portion are disposed opposite to each other.

16. The rollable display apparatus according to claim 15, wherein the main board corresponding to the first driving portion and the main board corresponding to the second driving portion both receive a synchronization signal.

17. The rollable display apparatus according to claim 16, wherein the main board of the first driving portion comprises a first synchronization end, the main board of the second driving portion comprises a second synchronization end, and the first synchronization end and the second synchronization end are connected by an auxiliary flexible circuit board.

18. The rollable display apparatus according to claim 17, wherein a side wall of the main board is connected to a side wall of the main flexible circuit board.

19. The rollable display apparatus according to claim 18, wherein the main flexible circuit board comprises a signal input end, and the signal input end is disposed on the side wall of the main flexible circuit board.

20. The rollable display apparatus according to claim 11, wherein the rollable display device comprises a first main board and a second main board, and the rollable display apparatus further comprises:
   a panel roller configured to wind the rollable display panel;
   a first housing for accommodating the panel roller and the first main board; and
   a second housing for accommodating the first main board;
   wherein one end of a support member is connected to the panel roller, and another end of the support member is connected to the second housing.

\* \* \* \* \*